United States Patent
Balakrishnan et al.

(10) Patent No.: US 9,893,207 B1
(45) Date of Patent: Feb. 13, 2018

(54) PROGRAMMABLE READ ONLY MEMORY (ROM) INTEGRATED IN TIGHT PITCH VERTICAL TRANSISTOR STRUCTURES

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/462,340

(22) Filed: Mar. 17, 2017

(51) Int. Cl.
| | |
|---|---|
| *H01L 29/788* | (2006.01) |
| *H01L 27/092* | (2006.01) |
| *H01L 29/06* | (2006.01) |
| *H01L 29/66* | (2006.01) |
| *H01L 21/8238* | (2006.01) |

(52) U.S. Cl.
CPC .. *H01L 29/7889* (2013.01); *H01L 21/823878* (2013.01); *H01L 21/823885* (2013.01); *H01L 27/092* (2013.01); *H01L 29/0649* (2013.01); *H01L 29/66825* (2013.01)

(58) Field of Classification Search
CPC ......... H01L 29/7889; H01L 21/823878; H01L 21/823885; H01L 29/0649; H01L 27/092; H01L 29/66825
See application file for complete search history.

(56) References Cited

U.S. PATENT DOCUMENTS

| | | | |
|---|---|---|---|
| 7,700,993 B2 | 4/2010 | Cai et al. | |
| 8,076,707 B1* | 12/2011 | Hyde | H01L 27/11519 257/314 |

OTHER PUBLICATIONS

Frohman-Bentchkowsky, D., "Fully Decoded 2048-Bit Electrically Programmable FAMOS Read-Only Memory" IEEE Journal of Solid-State Circuits (Oct. 1971) pp. 301-306, vol. SC-6, No. 5.
Hsu, C.C. et al., "A High Speed, Low Power P-Channel Flash EEPROM Using Silicon Rich Oxide as Tunneling Dielectric" Extended Abstracts of the 1992 International Conference on Solid State Devices and Materials (Oct. 1992) pp. 140-142.

* cited by examiner

*Primary Examiner* — David Vu
(74) *Attorney, Agent, or Firm* — Tutunjian & Bitetto, P.C.; Louis J. Percello

(57) ABSTRACT

A memory including a common floating gate structure in simultaneous electrical communication with a first fin structure of a first conductivity type vertically orientated semiconductor device and a second fin structure of a second conductivity type vertically orientated semiconductor device. A back bias electrode is present between the first and second fin structures embedded in a dielectric material positioned in a central portion of the common floating gate structure. The back bias electrode is present overlying an isolation region that is separating a first region of the substrate including the first conductivity type vertically orientated semiconductor device from a second region of the substrate including the second conductivity type vertically orientated semiconductor device.

20 Claims, 11 Drawing Sheets

PROGRAMMABLE READ ONLY MEMORY (ROM) INTEGRATED IN TIGHT PITCH VERTICAL TRANSISTOR STRUCTURES

BACKGROUND

Technical Field

The present disclosure relates to vertical transistors and memory devices.

Description of the Related Art

Modern integrated circuits are made up of literally millions of active devices such as transistors and memory devices. The geometry of vertical transistors is attractive due to their potential density with increased scaling requirements. Further vertical transistors can allow for relaxed gate lengths to better control electrostatics. New memory structures are desired to integrate with vertical transistors.

SUMMARY

In one embodiment, the methods and structures that are described herein provide a tight pitch vertical transistor read only memory (ROM) that is integrated into a vertical transistor process flow. In one embodiment, a memory device is provided that includes a common floating gate structure in simultaneous electrical communication with a first fin structure of a first conductivity type vertically orientated semiconductor device and a second fin structure of a second conductivity type vertically orientated semiconductor device. A back bias electrode is present between the first and second fin structures embedded in a dielectric material positioned in a central portion of the common floating gate structure. The back bias electrode is present overlying an isolation region that is separating a first region of the substrate including the first conductivity type vertically orientated semiconductor device from a second region of the substrate including a second conductivity type vertically orientated semiconductor device.

In another embodiment, the memory device includes a first conductivity type semiconductor device in a first region of a substrate and a second conductivity type semiconductor device in a second region of the substrate. A first source/drain region for each of the first and second conductivity type semiconductor devices is formed atop the substrate. A common floating gate structure is present in simultaneous electrical communication to a first vertically orientated channel region for the first conductivity type semiconductor device, and a second vertically orientated channel region for the second conductivity type semiconductor device. A back bias electrode is present between the first and second fin structures embedded in a dielectric positioned in a central portion of the common floating gate conductor. A commonly contacted second source/drain region is present on an end of the first and second vertically orientated channel regions that is opposite the first source/drain region for each of the first and second conductivity type semiconductor devices. A separate contact is in contact with each of the first source/drain regions.

In another aspect, a method is provided herein for forming a tight pitch vertical transistor read only memory (ROM) using a vertical transistor process flow. In one embodiment, the method may include forming a first conductivity type vertically orientated semiconductor device in a first region of a substrate; and forming a second conductivity type vertically orientated semiconductor device in a second region of the substrate. A common floating gate structure including a back bias electrode is formed in simultaneous electrical communication with a first fin structure of the first conductivity type vertically orientated semiconductor device and a second fin structure of the second conductivity type vertically orientated semiconductor device, wherein the back bias electrode is present between the first and second fin structures embedded in an dielectric positioned in a central portion of the common floating gate conductor.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
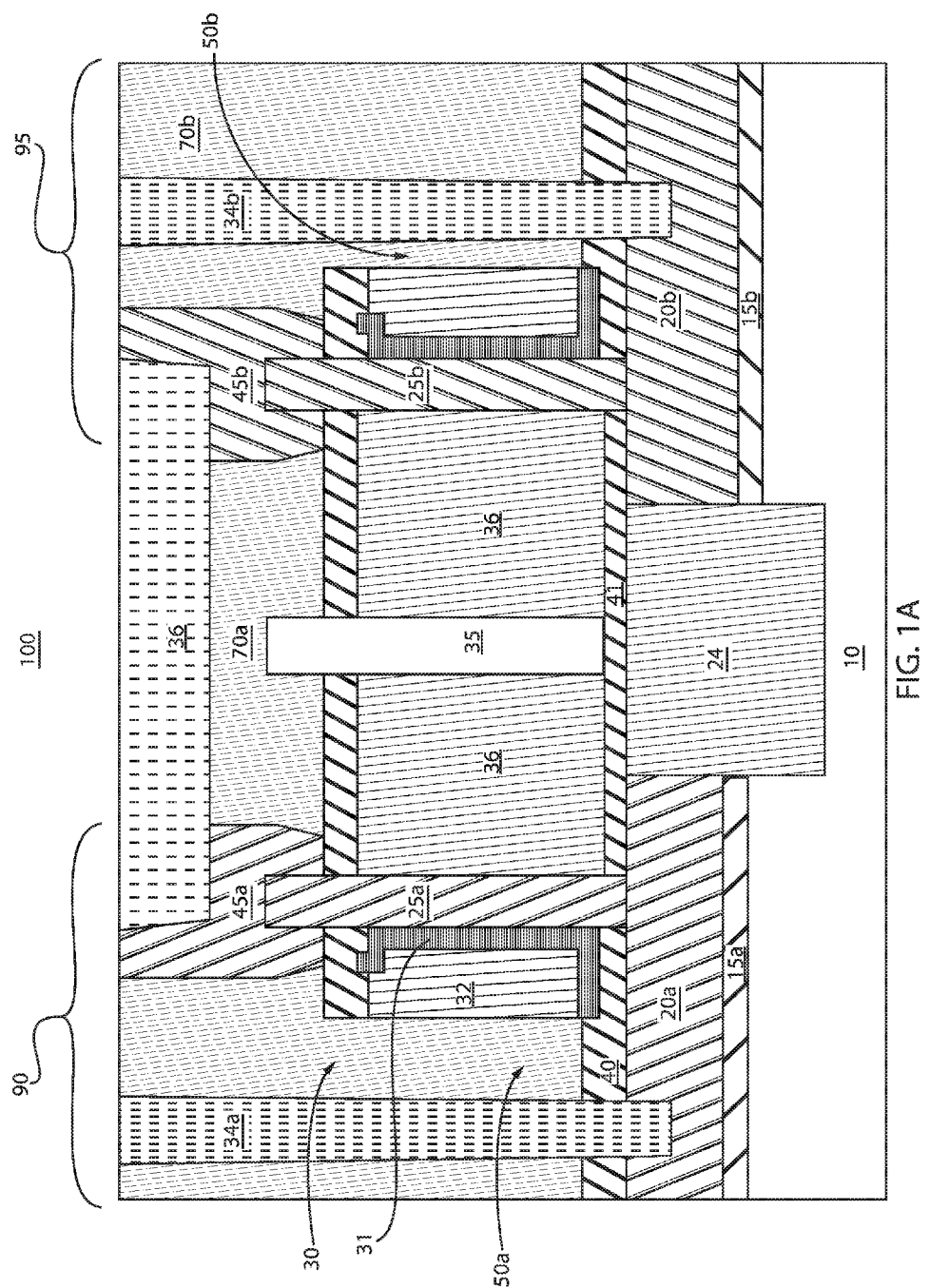
FIG. 1A is a side cross-sectional view of one embodiment of a tight pitch vertical transistor read only memory (ROM) device, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

With increasing scaling for next generation semiconductor devices, vertical field effect transistors (vFETs) have become increasingly attractive. For example, vertical FET devices are attractive for 5 nm device architecture due to sub-30 nm fin pitch and since they are not constrained by the contact poly pitch (CPP) and gate width scaling. Vertical transistors are attractive candidates for 5 nm node and beyond due to their potential of better density scaling and allowing relaxed gate lengths to better control the electrostatics. Memory, such as one time programmable read-only memories (ROMs) are needed as memory cells for use in combination with vertical transistors simultaneously on the same semiconductor wafer.

The methods and structures described herein provide a tight pitch vertical transistor read only memory (ROM) device. The transistor read only memory (ROM) device that is disclosed herein may be a one-time programmable read only memory (ROM) device that is integrated with a vertical transistor process flow. A programmable read-only memory (PROM) or field programmable read-only memory (FPROM) or one-time programmable non-volatile memory (OTP NVM) is a form of digital memory where the setting of each bit is locked by a fuse or antifuse. It is one of the type of ROM (read-only memory). One difference between a one time programmable read only memory (PROM) from a standard read only memory (ROM) is that the data is written into a ROM during manufacture, while with a PROM the data is programmed into them after manufacture. Thus, ROMs tend to be used only for large production runs with well-verified data, while PROMs are used to allow companies to test on a subset of the devices in an order before burning data into all of them.

As used herein a "field effect transistor" is a transistor in which output current, i.e., source-drain current, is controlled by the voltage applied to the gate. A field effect transistor has three terminals, i.e., gate, source and drain. A "gate structure" means a structure used to control output current (i.e., flow of carriers in the channel) of a semiconducting device through electrical fields. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel.

The field effect transistors of the present disclosure have a vertically orientated channel region that can be present within a fin structure. As used herein, a "fin structure" refers to a semiconductor material, which is employed as the body of a semiconductor device, in which the gate structure is positioned around the fin structure such that charge flows down the channel of the fin structure A finFET is a semiconductor device that positions the channel region of the semiconductor device in a fin structure. As used herein, the term "channel" is the region adjacent to the gate structure and between the source and drain of a semiconductor device that becomes conductive when the semiconductor device is turned on. The source and drain regions of the fin structure are the portions of the fin structure that are on opposing sides of the channel region of the fin structure. A "vertical" finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

In some embodiments, unlike a traditional layout, the vertically orientated NFET and PFET are adjacent to each other, which allows for less complexity in the layout of the wiring for the input, output and power supply lines to the NFET and PFET devices.

As noted above, the devices described herein include a tight pitch vertical transistor read only memory (ROM) device. In some embodiments, the memory device includes two vertically orientated transistors, e.g., an n-type vertically orientated fin field effect transistor and a p-type vertically orientated fin field effect transistor that share a common gate structure, i.e., a gate structure in electrical contact with the channel regions of both transistors simultaneously. In some embodiments, the memory device includes a back bias electrode. In some embodiments, the back bias electrode is present between the first and second fin structures that provide the vertically orientated channel regions for the n-type vertically orientated field effect transistor and the p-type vertically orientated field effect transistors. The back bias electrode may be embedded in a dielectric region positioned in a central portion of the common floating gate structure. The back bias electrode is also present overlying an isolation region that is separating the first region of the substrate in which the n-type vertically orientated fin field effect transistor is present from the second region of the substrate in which the p-type vertically orientated fin field effect transistor is present.

A gate electrode of the PFET and a gate electrode of the NFET are electrically connected to each other and electrically floating, thereby constituting a common floating gate. The common floating gate is electrically floating, i.e., is configured to retain electrical charges therein with negligible or non-existent leakage current. Some embodiments of structures disclosed herein, are now described in more detail with reference to FIGS. 1A-1B.

Figure 1B:
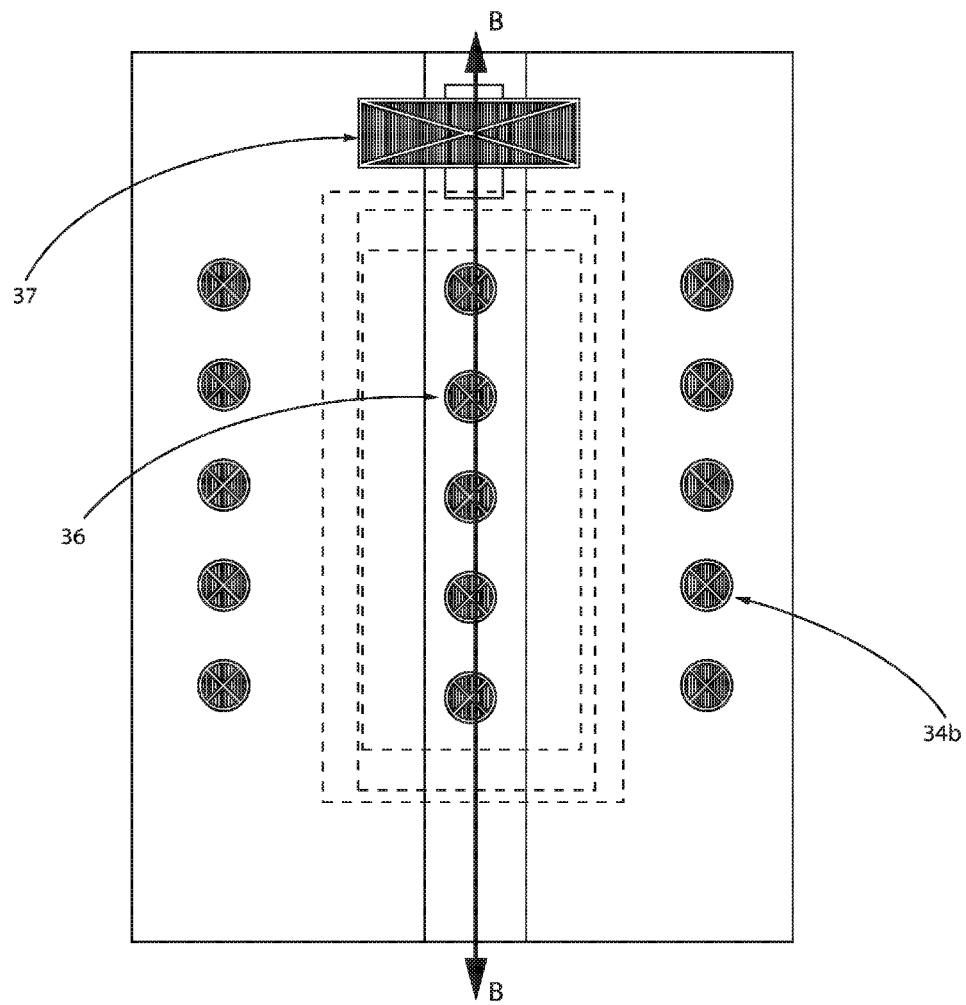
FIG. 1B is a top down view of the structure depicted in FIG. 1A, in which the structure depicted in FIG. 1A is along section line A-A of FIG. 1B.

Referring to FIGS. 1A and 1B, in some embodiments, the common floating gate vertical transistor read only memory (ROM) device 100, e.g., one time programmable read only memory (ROM), includes a first conductivity type region 90 and a second conductivity type region 95. The term "conductivity type" denotes whether the devices which the region have a p-type conductivity or an n-type conductivity. In some embodiments, the first conductivity type region 90 includes a vertically orientated fin type field effect transistor (VFET) 50a that includes a source region and a drain region that is doped to an n-type conductivity, and is therefore referred to as being an n-type vertically orientated fin type field effect transistor (n-type VFET) 50a. In some embodiments, the second conductivity type region 95 includes a vertically orientated fin type field effect transistor (VFET) 50b that includes a source region and a drain region that is doped to a p-type conductivity, and is therefore referred to as being an p-type vertically orientated fin type field effect transistor (p-type VFET) 50b. It is noted the first and second conductivity types may be reversed, i.e., the first conductivity region 90 may be composed of p-type devices, and the second conductivity region 95 may be composed of n-type devices. For the purposes of simplicity, the first conductivity type region 90 is hereafter referred to as an n-type conductivity region 90 and the second conductivity region 95 is referred to as a p-type conductivity type region 95.

Each of the n-type VFET and the p-type VFET may include a first source/drain region 20a, 20b that may be composed of epitaxially formed semiconductor material, which can be present overlying a supporting semiconductor substrate 10. In the example, depicted in FIGS. 1A and 1B, the first source/drain region 20a, 20b is a source region, but depending upon how the devices are configured to be biased, the first source/drain region 20a, 20b can equally be a drain region. In some embodiments, the first source/drain region 20a, 20b is separated from the supporting semiconductor substrate 10 by a counter doped region 15a, 15b. The term "counter doped" means that the counter doped region 15a, 15b has an opposite conductivity type as the first source/drain region 20a, 20b. For example, when the first source/drain region 20a that is present in the n-type device region 90 has an n-type conductivity, the counter doped region 15a that is present in the n-type device region 90 has a p-type conductivity; and when the first source/drain region 20b that is present in the p-type device region 95 has a p-type conductivity, the counter doped region 15b may have an n-type conductivity.

The first source/drain region 20a, 20b, the counter doped regions 15a, 15b, and the supporting substrate 10 may each be composed of a semiconductor material, such as a type IV or type III-V semiconductor. Examples of type IV semiconductors that are suitable for use as the base material for the first source/drain region 20a, 20b, the counter doped regions 15a, 15b, and the supporting substrate 10 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. Examples of type III-V materials can include gallium arsenic (GaAs).

Although the supporting substrate 10 is depicted as a bulk substrate, in other embodiments, the supporting substrate 10 may be a semiconductor on insulator (SOI) substrate. As will be further described below the first source/drain region 20a, 20b, and the counter doped regions 15a, 15b may be formed by ion implantation into the supporting substrate 10 or epitaxial growth atop the supporting substrate 10.

Referring to FIGS. 1A and 1B, the n-type conductivity region 90 may be separated from the p-type conductivity region 95 by an isolation region 24, such as a shallow trench isolation (STI) region. The isolation region 24 may be composed of a dielectric material, such as an oxide, e.g., silicon oxide, or a nitride, e.g., silicon nitride.

Each of the n-type VFET 50a and the p-type VFET 50b may include a fin structure 25a, 25b for the channel region of the device. Similar to the source/drain region 20a, 20b, and the counter doped regions 15a, 15b, each of the fin structures 25a, 25b may be composed of a semiconductor material, e.g., a type IV semiconductor material, such as silicon or germanium, or a type III-V semiconductor material, such as gallium arsenic (GaAs). The fin structures 25a, 25b may have a height ranging from 5 nm to 200 nm. In another embodiment, each of the fin structures 25a, 25b has a first height ranging from 10 nm to 100 nm. In one example, each of the fin structures 25a, 25b has a height ranging from 20 nm to 50 nm. Each of fin structures 25a, 25b may have a width ranging from 5 nm to 20 nm. In another embodiment, each of the fin structures 25a, 25b has a width ranging from 5 nm to 15 nm. In one example, each fin structure 25a, 25b has a width that is equal to 10 nm. The pitch separating the fin structures 25a, 25b from their adjacent back bias electrode 35 may range from 10 nm to 50 nm. In another embodiment, the pitch separating the fin structures 25a, 25b from the back bias electrode 35 may range from 20 nm to 50 nm. In one example, the pitch is equal to 30 nm.

Referring to FIG. 1A, the common floating gate vertical transistor read only memory (ROM) device 100, e.g., one time programmable read only memory (ROM), includes a common floating gate structure 30 in simultaneous electrical communication with a first fin structure 25a of the first conductivity type vertically orientated semiconductor device and a second fin structure 25b of the second conductivity type vertically orientated semiconductor device. A back bias electrode 35 is present between the first and second fin structures 25a, 25b embedded in an dielectric material 36 positioned in a central portion of the common floating gate structure 30. The back bias electrode 35 overlying an isolation region 24 that is separating the first region 90 of the substrate 10 from the second region 95 of the substrate 10. The back bias electrode 35 may be composed of an electrically conductive material. "Electrically conductive" as used through the present description means a material typically having a room temperature conductivity of greater than $10^{-8}$ $(\Omega\text{-m})^{-1}$. The electrically conductive material that provides the back bias electrode 35 may be a doped semiconductor, such as n-type doped polysilicon. In other embodiments, the electrically conductive material that provides the back bias electrode 35 may be a metal, such as tantalum (Ta), tungsten (W), titanium (Ti), copper (Cu), aluminum (Al), platinum (Pt), gold (Au), silver (Ag) or a combination thereof. In other embodiments, the electrically conductive material may be a nitride of the aforementioned metal, such as tantalum nitride (TaN), tungsten nitride (WN), titanium nitride (TiN) or a combination thereof. As will be discussed further below, the back bias electrode 35 is formed during a process flow during the formation of the fin structures 25a, 25b. Therefore, in some embodiments, the dimensions of the back bias electrode 35 are equal to the dimensions of the fin structures 25a, 2b. For example, the back bias electrode 35 may have a height ranging from 5 nm to 200 nm. In another embodiment, the back bias electrode 35 has a first height ranging from 10 nm to 100 nm. In one example, the back bias electrode has a height ranging from 20 nm to 50 nm. The back bias electrode may have a width ranging from 5 nm to 20 nm. The back bias electrode has a width ranging from 5 nm to 15 nm. In one example, the back bias electrode has a width that is equal to 10 nm.

Still referring to FIG. 1A, the back bias electrode 35 may be separated from the isolation region 24, e.g., STI, by an electrode spacer 41. The electrode spacer 41 may be composed of an oxide, nitride or oxynitride dielectric material. For example, the electrode spacer 41 may be composed of silicon oxide, silicon nitride, or silicon oxynitride. The electrode spacer 41 may also be composed of other low-k dielectric materials as further described throughout the present disclosure for providing the other spacers within the structure.

The common gate structure 30 includes a gate dielectric 31 and a gate electrode 32. The gate electrode 32 is a single structure of an electrically conductive material that is simultaneously in contact with a portion of the gate dielectric that is present on the fin structures 25a, 25b for each of the n-type VFET 50a and the p-type VFET 50b. FIGS. 1A and 1B illustrate that there is no direct contact to the common gate structure 30. Therefore, the common gate structure 30 is floating. The gate dielectric 31 may be composed of any dielectric material, such as an oxide, nitride or oxynitride material. In some embodiments, the gate dielectric 31 is a high-k dielectric material. As used herein, "high-k" denotes a dielectric material featuring a dielectric constant (k) higher than the dielectric constant of $SiO_2$ at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 22a include hafnium silicate, hafnium silicon oxynitride or combinations thereof. In one embodiment, the gate dielectric 31 has a thickness ranging from about 1.0 nm to about 6.0 nm.

The gate electrode 32 may be composed of a doped semiconductor that is electrically conductive, such as n-type doped polysilicon, or the gate electrode 32 may be composed of a metal, such as a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof.

Still referring to FIGS. 1A and 1B, the common gate structure 30 may be separated from the first source/drain region 25a, 25b by a first dielectric spacer 40 (which may be referred to as the bottom spacer) and the second source drain/region 45a, 45b (described below) may be separated from the common gate structure 30 by a second dielectric spacer 51 (which may be referred to as the top spacer). Each of the first and second dielectric spacer 40, 51 may be composed of an oxide, such as silicon oxide, nitride, such as silicon nitride or a combination thereof.

The second source/drain region 45a, 45b is present on the opposite side of the fin structures 25a, 25b that provide the channel regions for the n-type VFET 50a and the p-type VFET 50b than the first source/drain regions 25a, 25b. The second source/drain regions 45a, 45b typically has the same conductivity type as the corresponding first source/drain regions 25a, 25b. For example, the second source/drain region 45a that is present in the n-type region 90 is typically doped to an n-type conductivity, and the second source/drain region 45b that is present in the p-type region 59 is doped to a p-type conductivity. Similar to the first source/drain region 25a, 25b, the second source/drain regions 45a, 45b may be composed of a semiconductor material, e.g., a type IV semiconductor materials, such as silicon (Si) or germanium (Ge), or a type III-V semiconductor material, such as gallium arsenide (GaAs). In some embodiments, the second source/drain regions 45a, 45b are formed using an epitaxial deposition process atop an exposed surface of the fin structures 25a, 25b. Although, the second source/drain regions 45a, 45b are depicted as drain regions in FIGS. 1A and 1B, the second source/drain regions 45a, 45b may also be source regions depending upon how the device is biased.

Still referring to FIGS. 1A and 1B, the tight pitch vertical transistor read only memory (ROM) device 100 may also include a dielectric layer 70a, 70b encapsulating the device, wherein contacts 34a, 34b, 36 to the first source/drain region 25a, 25b, and the second source/drain regions 45a, 45b extend through the dielectric layer 70a, 70b. Referring to FIG. 1B, in some embodiments, a common electrical contact 36 is in direct contact with the second source/drain regions 45a, 45b. The common electrical contact 36 is the only contact to each of the second source/drain regions 45a, 45b of the n-type VFET 50a and the p-type VFET 50b, in which the common electrical contact 36 is in direct contact with both of the second source/drain regions 45a, 45b simultaneously. In some embodiments, a first contact 34a is in direct contact with the first source/drain region 25a of the n-type VFET 50a, and a second contact 34b is in direct contact with the first source/drain region 25b of the p-type VFET 50b, in which the first and second contact 34a, 34b are separate from one another. There is no contact directly to the common gate structure 30, i.e., the common gate structure 30 is a floating gate. Referring to FIG. 1B, the contact 37 to the back bias electrode 45 is present over an extension of the isolation region 24 and is offset from the contacts 34a, 34b, 36 for the first source/drain region 25a, 25b and the second source/drain region 45a, 45b.

Some embodiments of methods for forming the structures depicted in FIGS. 1A and 1B are now described in greater detail with further reference to FIGS. 2-11.

Figure 2:
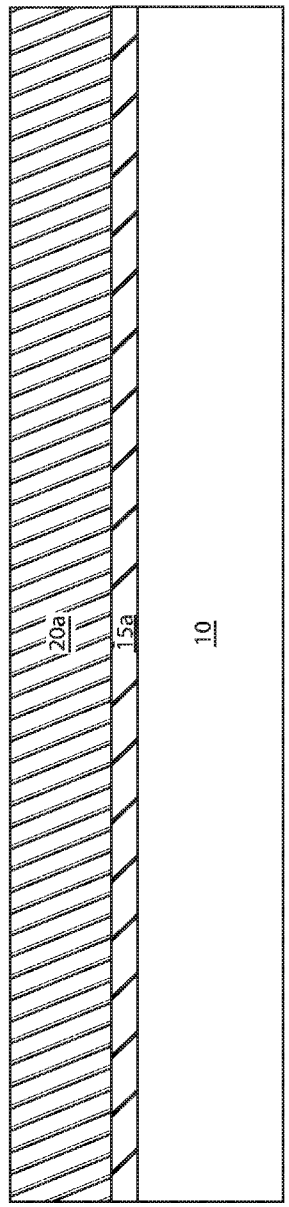
FIG. 2 is a side cross-sectional view depicting one embodiment of an initial material stack used in forming a memory device, in accordance with the present disclosure.

FIG. 2 depicts one embodiment of an initial material stack used in forming a vertical transistor read only memory (ROM) device 100. In some embodiments, the initial material stack includes a supporting substrate 10, a counter doped layer 15a, and a material layer for provide a first source/drain region 20a. The supporting substrate 10 has been described above with reference to FIGS. 1A and 1B. The counter doped layer 15a may be formed on the upper surface of the supporting substrate 10 by ion implantation into the upper surface of the supporting substrate 10 or by epitaxial growth in combination with in situ doping or ion implantation. The counter doped layer 15a depicted in FIG. 2 is processed to provide the counter doped layer 15a within the n-type region 90 of the structure depicted in FIGS. 1A and 1B. Therefore, in this example, the counter doped layer 15a is doped to a p-type conductivity. The counter doped layer 15a may have a thickness ranging from 5 nm to 50 nm. The material layer for providing the first source/drain regions 20a may also be formed using ion implantation or epitaxial growth in combination with ion implantation or in situ doping. The material layer for providing the first source/drain region 20a typically provides the first source/drain region for the n-type VFET 50a within the n-type region 90. Therefore, the first source/drain region 20a is typically doped to an n-type conductivity. The thickness for the material layer for providing the first source/drain region 20a typically has a thickness ranging from 10 nm to 100 nm.

Figure 3:
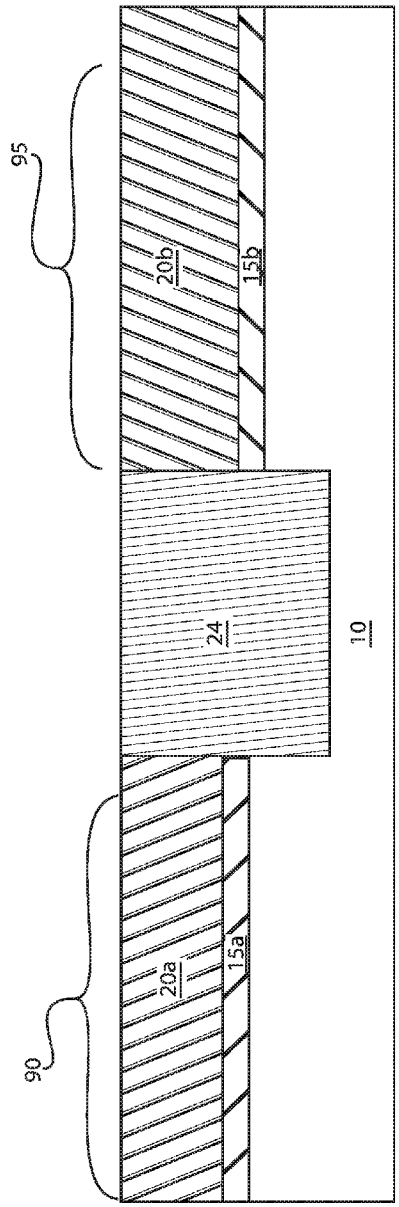
FIG. 3 is a side cross-sectional view depicting one embodiment of processing the structure depicted in FIG. 2 to provide an n-type region and a p-type region, in accordance with present disclosure.

FIG. 3 depicts one embodiment the structure depicted in FIG. 2 following processing to provide an n-type region 90 and a p-type region 95. As noted above, the material layer for providing the first source/drain region 20a typically provides the first source/drain region for the n-type VFET 50a within the n-type region 90, and the counter doped layer 15b provides the counter doped layer for the n-type VFET 50a in the n-type region 90.

An isolation region 24 is formed to isolate the n-type region 90 from the p-type region 95. The isolation region 24 is formed by etching a trench, e.g., by reactive ion etch, through the material layers for the first counter doped layer 15a, and the material layer for the first source/drain region 20a for the n-type VFET 50a into the supporting substrate 10. The trench is then filled with a dielectric material, such as an oxide, e.g., silicon oxide ($SiO_2$), or a nitride, such as silicon nitride. The deposition process may be a chemical vapor deposition process.

Following formation of the isolation region 24, the portion of the structure that provides the n-type region 90 may be protected by forming an etch mask thereon, while the portions of the first counter doped layer 15a and the material layer for the first source/drain region 20a for the n-type VFET 50a that are exposed by the etch mask are removed, e.g., via etch process. The etch mask may be a photoresist mask that is patterned using photolithography. The etch mask may also be provided by a hard mask, e.g., a mask composed of a dielectric material layer, such as silicon nitride. The etch process or removing the exposed portions of the first counter doped layer 15a, and the material layer for the first source/drain region 20a for the n-type VFET 50a that are present in the p-type region 95 may be removed by an etch process, such as a selective etch process. For example, the etch process for removing the portions of the first counter doped layer 15a, and the material layer for the first source/drain region 20a for the n-type VFET 50a that are present in the p-type region 95 may include an etch process that is selective to the supporting substrate 10. In some embodiments, the etch process may be an anisotropic etch process, such as reactive ion etch.

Still referring to FIG. 2, the second counter doped layer 15b, and the material layer for providing the first source/drain region 20b of the p-type VFET 50b may be formed on the portion of the supporting substrate 10 that is present in the p-type region 95. In one embodiment, the second counter doped layer 15b is formed using epitaxial growth. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxially formed second counter doped layer 15b, and the material layer for providing the first source/drain region 20b of the p-type VFET 50b can be a type IV semiconductor containing material layer. For example, the epitaxially formed in situ doped n-type semiconductor material 15b may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. A number of different sources may be used for the epitaxial deposition of the in situ doped n-type semiconductor material 15b. In some embodiments, the gas source for the deposition of an epitaxially formed in situ doped n-type semiconductor material 15b may include silicon (Si) deposited from silane, disilane, trisilane, tetrasilane, hexachlorodisilane, tetrachlorosilane, dichlorosilane, trichlorosilane and combinations thereof. In other examples, when the in situ doped n-type semiconductor material 15b includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

The epitaxially formed second counter doped layer 15b, and the material layer for providing the first source/drain region 20b of the p-type VFET 50b can each be doped using ion implantation or may be doped in situ. By "in-situ" it is meant that the dopant that dictates the conductivity type of the second counter doped layer 15b, and the material layer for providing the first source/drain region 20b of the p-type VFET 50b is introduced during the process step, e.g., epitaxial deposition, that forms the second counter doped layer 15b, and the material layer for providing the first source/drain region 20b of the p-type VFET 50b.

As noted above, the second counter doped layer 15b is typically doped to an n-type conductivity. The n-type gas dopant source may include arsine ($A_xH_3$), phosphine ($PH_3$) The first source/drain region 20b of the p-type VFET 50b is typically doped to a p-type conductivity. A p-type dopant, such as borane and diborane gas, may be employed to in situ dope the first source/drain region 20b of the p-type VFET 50b.

The second counter doped layer 15b may have a thickness ranging from 5 nm to 50 nm. The thickness of the material layer for the first source/drain region 20b typically ranges from 10 nm to 100 nm.

Figure 4:
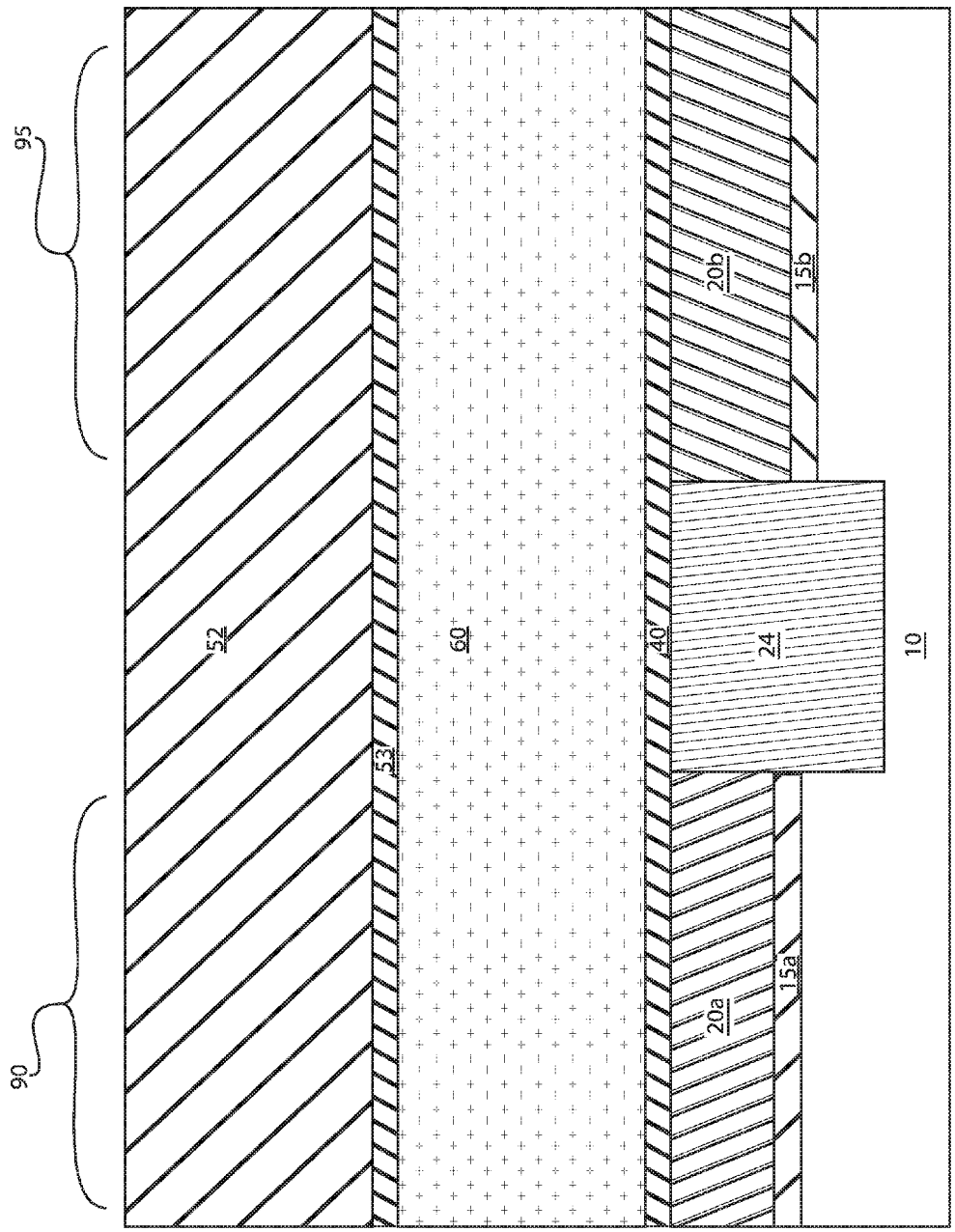
FIG. 4 is a side cross-sectional view depicting one embodiment of forming a material stack for producing a sacrificial gate structure on the structure depicted in FIG. 3.

FIG. 4 depicts one embodiment of forming a material stack for producing a sacrificial gate structure on the structure depicted in FIG. 3. In some embodiments, the material stack may include a first dielectric spacer layer that provides the first spacer 40 (also referred to as bottom spacer) of the n-type VFET 50a and p-type VFET 50b, a sacrificial gate structure layer 60, a sacrificial spacer layer 53 and a cap dielectric layer 52. Each of the aforementioned layers may be formed atop the structure depicted in FIG. 3 using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

The first dielectric spacer layer that provides the first spacer 40 may be composed of any dielectric material, and in some instances may be composed of silicon oxide or silicon nitride. In some embodiments, the first spacer 40 can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the first dielectric spacer layer may range from 5 nm to 20 nm.

The sacrificial gate structure layer 60 may be composed of any material that can be removed selectively to the first dielectric spacer layer. In some embodiments, the sacrificial gate structure layer 60 may be composed of a silicon containing material, such as amorphous silicon (α-Si). The sacrificial spacer layer 53 is similar to the first dielectric spacer layer. For example, the sacrificial spacer layer 53 may be composed of silicon oxide or silicon nitride. The cap dielectric layer 52 in some examples may be composed of an oxide, such as silicon oxide. The selection of the composition of the cap dielectric layer 52 and the sacrificial spacer layer 51 can be selected to provide that the cap dielectric layer 52 can be removed by an etch process that is selective to the sacrificial spacer layer 53. The sacrificial spacer layer 53 protects the sacrificial gate structure layer 60 from being etched by the process steps that remove the cap dielectric layer 53. The thickness of the cap dielectric layer 52 is selected to provide a portion of the fin structures for forming the upper source/drain region, i.e., second source/drain region 45a, 45b.

Figure 5:
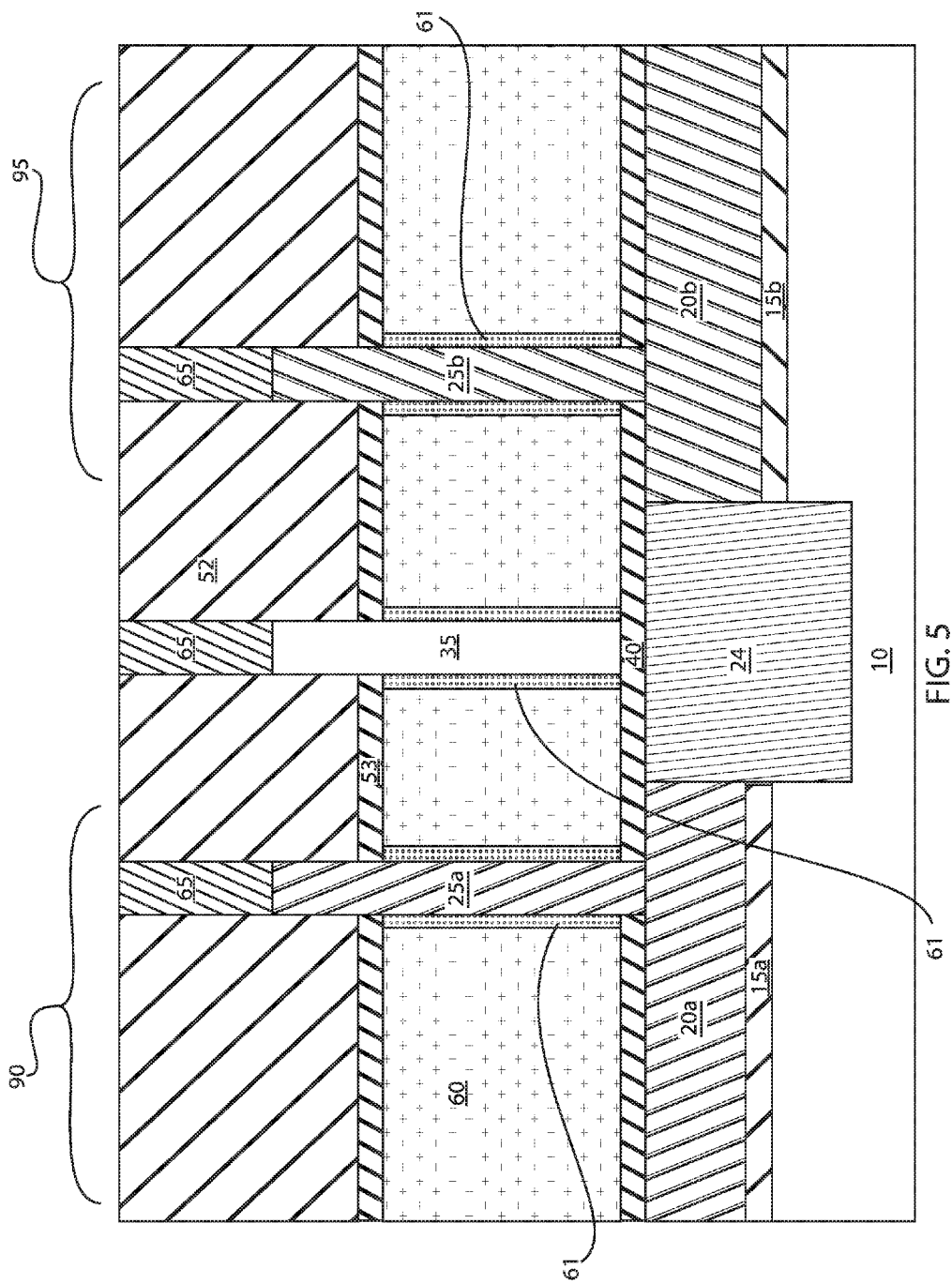
FIG. 5 is a side cross-sectional view depicting forming fin structures within the n-type region and the p-type region, and forming a back bias electrode overlying the isolation region separating the n-type and p-type regions of the substrate.

FIG. 5 depicts forming fin structures 25a, 25b within the n-type region 90 and the p-type region 95, and forming the back bias electrode 35 atop the isolation region 24, e.g., STI region. The fin structures 25a, 25b provide the channel regions for the devices in the CMOS arrangement of transistors in the vertical transistor read only memory (ROM) device 100. In some embodiments, forming the fin structures 25a, 25b and forming the back bias electrode 35 may begin with forming fin structure openings and a back bias opening through the material stack. The fin structure openings are formed using deposition, photolithography and etch processes. First, an etch mask is formed atop the material stack including the sacrificial gate layer 60 having openings exposing the portions of the material stack, in which the fin structure openings are formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 53, the sacrificial spacer layer 52, as well as a portion of the first spacer layer 40 to expose a surface of the first source/drain region 20a, 20b to provide an epitaxial deposition surface for forming the fin structures 25a, 25b. The etch process for forming the back bias electrode opening is terminated on the dielectric layer for the first spacer 40, i.e., does not etch through the dielectric layer for the first spacer 40.

In some embodiments, the etch process for forming the fin structure openings may be selective to the material of the first source/drain region 20a, 20b. In some embodiments, the etch process for forming the fin structure openings may be selective to the material of the dielectric layer 40 for the first spacer. For example, the etch process for forming the fin structure openings can be a reactive ion etch process.

Still referring to FIG. 5, following the formation of the fin structure openings, a thermal oxidation process forms a dielectric surface 61 of the sidewall surface of the sacrificial gate layer 60 that are exposed within the fin structure openings and the back bias electrode opening. In the embodiments in which the sacrificial gate layer 60 is composed of a silicon containing material, the dielectric surface 61 may be composed of an oxide, such as silicon oxide.

In a following process step, the fin structures 25a, 25b are formed filling the fin structure openings using an epitaxial deposition process that employs the exposed surface of the first source/drain region 20a, 20b at the base of the fin structure openings as an epitaxial deposition growth surface. The epitaxial semiconductor material that provides the fin structures 25a, 25b does not form on dielectric surfaces, such as the dielectric cap layer 53 or the dielectric surface 61 of the sacrificial gate layer 60. The epitaxial growth process for forming the fin structures 25a, 25b is similar to the epitaxial growth process that is described above for forming the first source/rain region 20b and the second counter doped layer 15. Therefore, the above description for epitaxially forming the first source/rain region 20b and the second counter doped layer 15 is suitable for describing at least one method of the epitaxial deposition processes used to form the fin structures 25a, 25b.

The geometry and composition of the fin structures 25a, 25b that are formed in FIG. 5 have been described in greater detail with reference to FIGS. 1A and 1B. In some embodiments, the fin structure 25a to the n-type VFET 50a that is present within the n-type region 90 has the same composition as the p-type VFET 50b in the p-type region 95. In other embodiments, the fin structure 25a to the n-type VFET 50a that is present within the n-type region 90 has a different composition from the p-type VFET 50b in the p-type region 95. To provide that the fin structures 25a, 25b have different epitaxial compositions, block masks may be employed. For example, a first block mask, e.g., photoresist mask, may be formed over the p-type region 95 protecting the fin structure opening present within that region, while a first epitaxial deposition process forms a fin structure 25a within the n-type region 90. Thereafter, the first block mask may be removed, and a second block mask may be formed exposing the fin structure opening in the p-type region 95 while covering the fin structure 25a previously formed in the n-type region 90. In this example, a second epitaxial deposition process may be used to form the fin structure 25b in the p-type region 95 having a different composition than the fin structure 25a formed by the first epitaxial deposition process in the n-type region 90.

In some embodiments, when the back bias electrode 35 is composed of an electrically conductive semiconductor material, such as n-type doped polysilicon, the back bias electrode 35 may be formed using a chemical vapor deposition (CVD) process to fill the back bias electrode opening. For example, a back bias electrode 35 composed of a semiconductor material may be deposited using a chemical vapor deposition process, such as plasma enhanced chemical vapor deposition (PECVD), metal organic chemical vapor deposition (HDPCVD), room temperature/low temperature chemical vapor deposition, and derivatives and combinations thereof.

In some embodiments, to provide that the semiconductor material formed for the back bias electrode 35 is electrical conductive, the semiconductor material for the back bias electrode 35 may be in situ doped. Although a polycrystalline back bias electrode 35 is typically doped to an n-type conductivity, embodiments have been contemplated, in which the semiconductor material of the back bias electrode 35 is doped to a p-type conductivity. Additionally, in some embodiments, ion implantation may be used to dope the semiconductor material for the back bias electrode 35, which can be used in combination with or is substituted for in situ doping. In further embodiments, the back bias electrode 35 may be composed of a metal that is formed using physical vapor deposition (PVD), such as sputtering, or plating, such as electroplating or electroless plating. A back bias electrode 35 composed of a metal may also be formed filling the back bias electrode opening using chemical vapor deposition or atomic layer deposition. To provide that the back bias electrode 35 has a different conductivity and dopant type from the fin structures 25a, 25b, block masks may be employed.

FIG. 5 further depicts recessing the epitaxially formed fin structures 25a, 25b, and the back bias electrode 35 and forming a dielectric cap 65 on the recessed surfaces of the fin structures 25a, 25b and the recessed surface of the back bias electrode 35. The fin structures 25a, 25b may be recessed using an etch that is selective to the cap dielectric layer 52. Etching the epitaxially formed fin structures 25a, 25b forms a recess in the upper portions of the fin structure openings. Etching the back bias electrode 35 forms a recess in the upper portions of the back bias electrode openings. The recess is filled with a deposited dielectric material to provide the dielectric cap 65. In some embodiments, the dielectric cap 65 may be composed of a nitride, such as silicon nitride, that is deposited using chemical vapor deposition (CVD), such as plasma enhanced chemical vapor deposition (PECVD).

Figure 6:
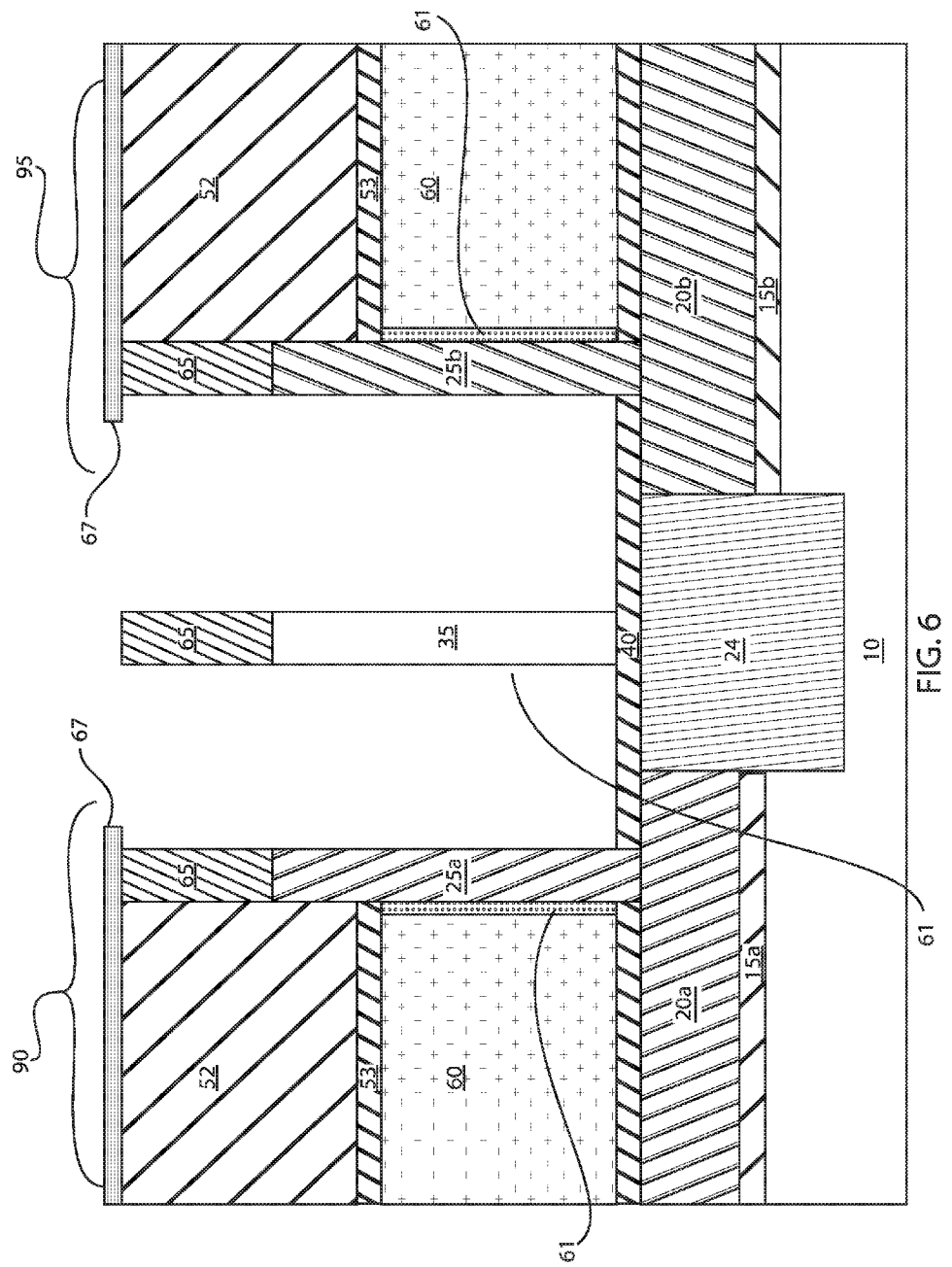
FIG. 6 is side cross-sectional view depicting removing the portions of the material stack including the sacrificial gate layer that are separating the back bias electrode from the fin structures.

FIG. 6 depicts removing the portions of the material stack including the sacrificial gate layer 60 that are separating the back bias electrode 35 from the fin structures 25a, 25b. The etch process for removing the portions of the material stack that is present between the fin structures 25a, 25b and the back bias electrode 35 may begin with forming an etch mask 67, e.g., photoresist mask, that is present over, i.e., protecting, the portions of the material stack that are present on the sides of the fin structures 25a, 25b, in which the common gate structure 30, and the contacts to the first source/drain regions 20a, 20b are subsequently formed. The portions of the material stack that is present between the fin structures 25a, 25b and the back bias electrode 35 that is to be removed is exposed by an opening through the etch mask. The exposed portions of the material stack, i.e., exposed portions of the cap dielectric layer 52, sacrificial spacer layer 53 and the sacrificial gate conductor layer 60, may then be removed using an etch process. For example, the etch process may remove the exposed portions of the material stack using an etch that is selective to the first dielectric layer 40 and the dielectric cap 65 that is present atop the back bias electrode 35. The etch process may be a dry etch, such as a plasma etch or reactive ion etch, or a wet etch, such as a chemical etch. In some embodiment, the etch process is anisotropic.

Figure 7:
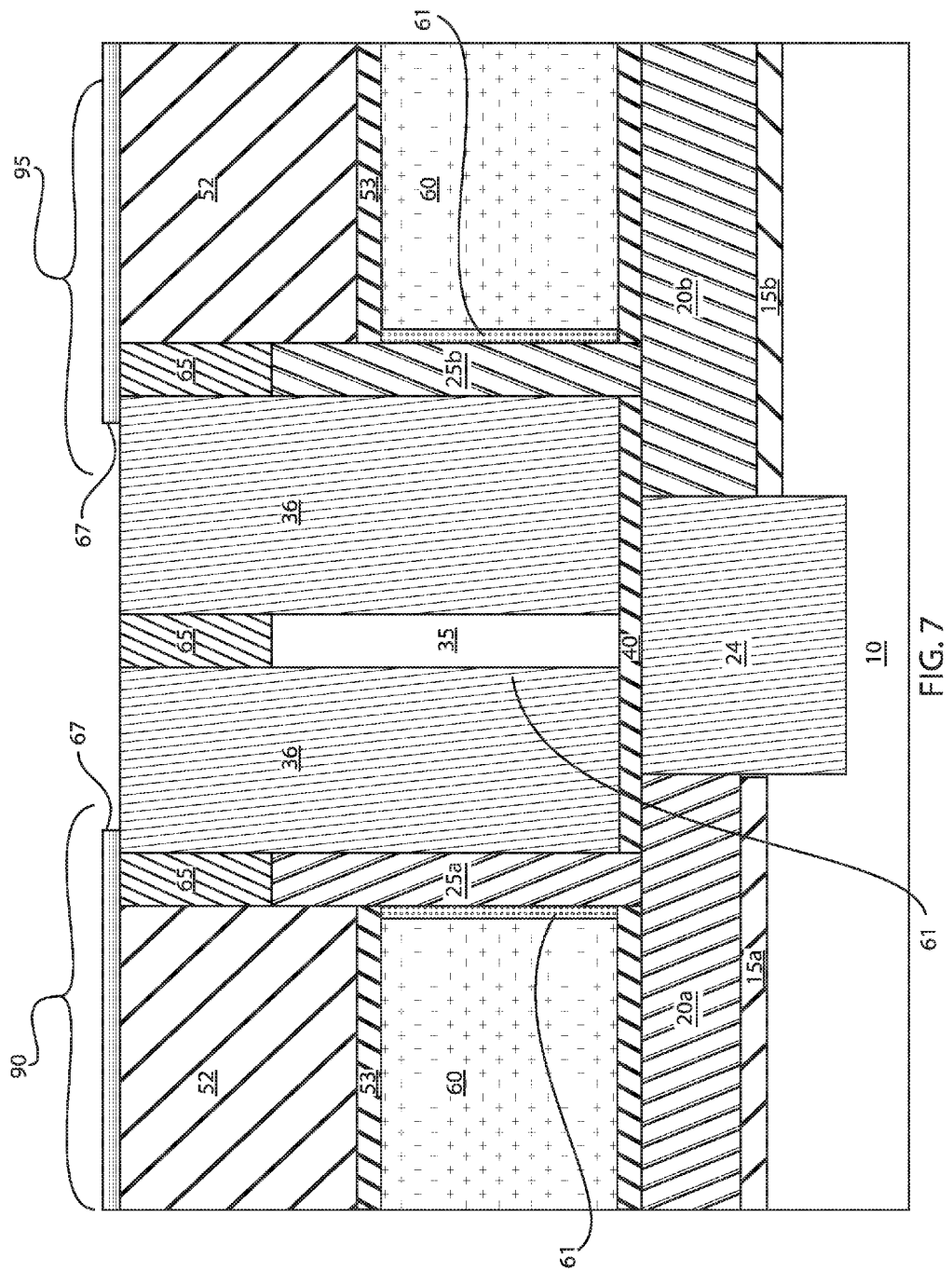
FIG. 7 is a side cross-sectional view depicting filling trenches formed by removing the material stack including the sacrificial gate layer from between the back bias electrode and the fin structures with a dielectric material.

FIG. 7 depicts one embodiment of filling trenches formed by removing the material stack including the sacrificial gate layer 60 from between the back bias electrode 35 and the fin structures 25a, 25b with a dielectric material 36. The dielectric material 36 may be any dielectric material 36, such as an oxide, e.g., silicon oxide, such as a nitride, e.g., silicon nitride, or a combination thereof. In other examples, the dielectric layer 36 may be a low-k dielectric, such as diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The dielectric material 36 may be deposited using a chemical vapor deposition process, such as plasma enhanced chemical vapor deposition, or using spin on deposition. Following deposition, a planarization process, such as chemical mechanical planarization (CMP), may be applied to the upper surface of the dielectric material 36. Following deposition, the dielectric material 35 may be densified by annealing, ultraviolet curing, plasma processing or combinations thereof.

Figure 8:
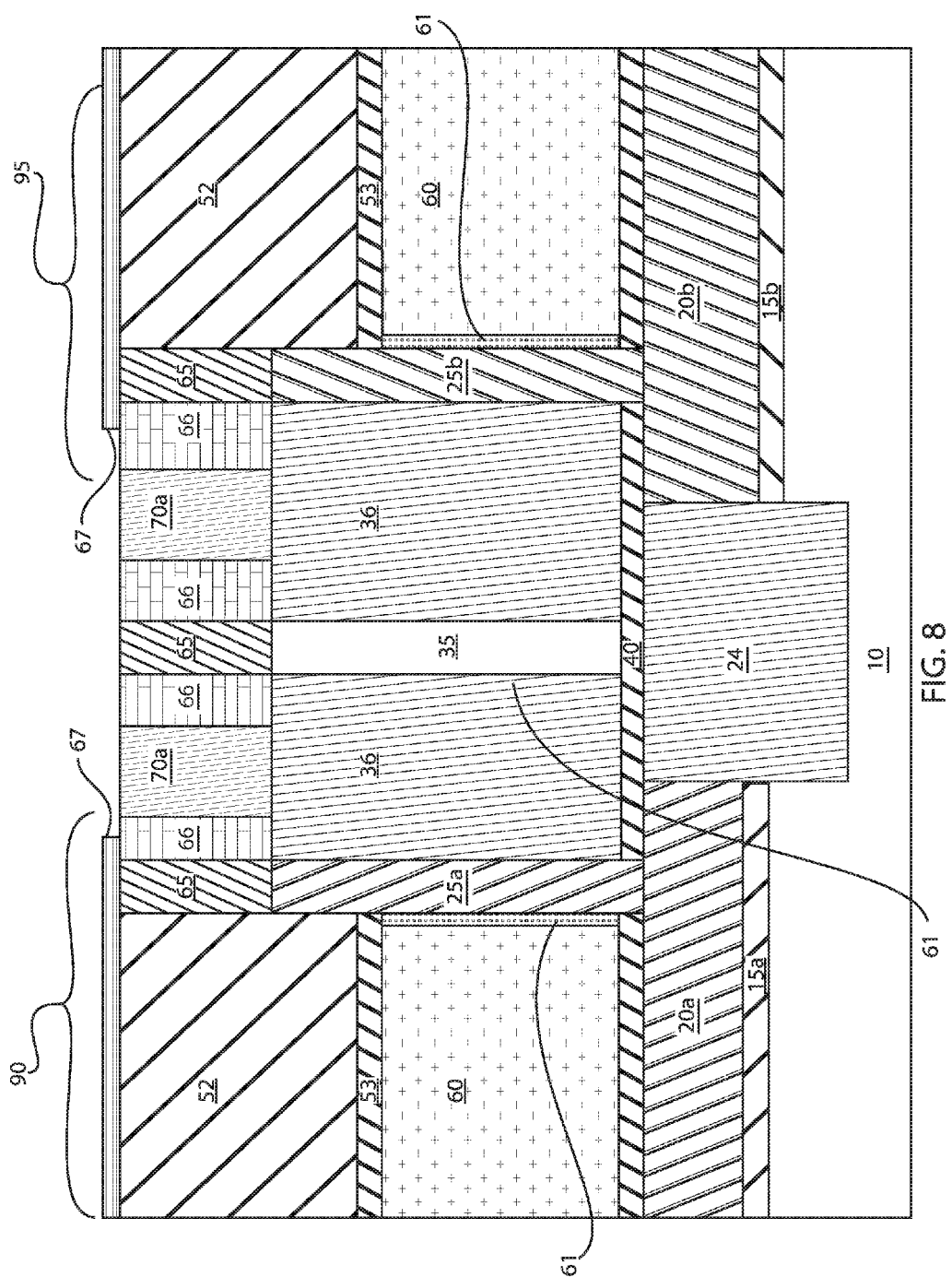
FIG. 8 is side cross-sectional view depicting one embodiment of recessing the dielectric material present within the trenches separating the fin structures from the back bias electrode, forming a spacer atop the recessed surface of the dielectric material, and forming first sidewall spacers on exposed sidewalls of the fin structures and back bias electrode, and forming a first interlevel dielectric layer, in accordance with one embodiment of the present disclosure.

FIG. 8 depicting one embodiment of recessing the dielectric material 36 present within the trenches separating the fin structures 25a, 25b from the back bias electrode 35. The dielectric material 36 may be recessed so that the upper surface of the recessed dielectric material 36 is substantially coplanar with the remaining portions of the sacrificial spacer layer 53. The dielectric material 36 may be recessed by an etch process that is selective to the dielectric cap 65 that is present atop the back bias electrode 35. The etch process may be an anisotropic etch process, such as reactive ion etching. In other embodiments, a wet etch process may recess the dielectric material 36.

In a following step, a second dielectric spacer 51 may be formed on the recessed surface of the dielectric material. The second dielectric spacer 51 may be composed of any dielectric material, such as an oxide, nitride, or oxynitride material. For example the second dielectric spacer 51 may be silicon nitride. The second dielectric spacer 51 may be deposited using chemical vapor deposition, e.g., plasma enhanced chemical vapor deposition (PECVD).

FIG. 8 also depicts forming a first sidewall spacers 66 on the exposed sidewalls of the fin structures 25a, 25b and the back bias electrode 35 atop the recessed surface of the dielectric material 36. The first sidewall spacers 66 are formed on the exposed upper sidewalls of the fin structures 25a, 25b and back bias electrode 35 using a conformal deposition process, such as plasma enhanced chemical vapor deposition (PECVD), following by an anisotropic etchback process, such as reactive ion etch (RIE). The first sidewall spacers 66 may be composed of an oxide, such as silicon oxide, a nitride, such as silicon nitride, or a low-k dielectric material, such as the low-k compositions that have been described above for the dielectric material 36 present between the back biased electrode 35 and the fin structures 25a, 25b.

Figure 9:
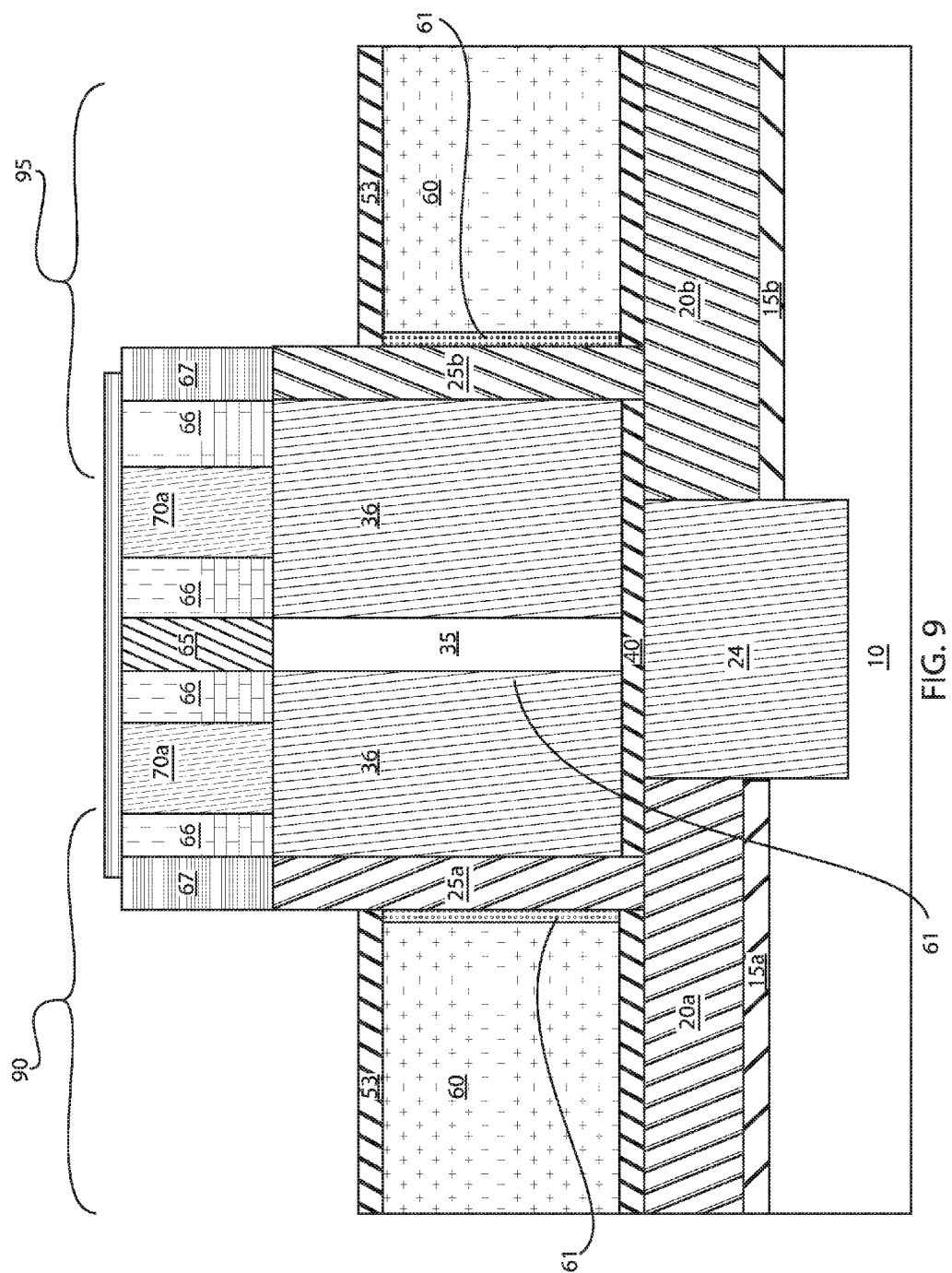
FIG. 9 is a side cross-sectional view depicting one embodiment of forming a second sidewall spacer on outside sidewalls of the first and second fin structures.

FIG. 9 also depicts forming a first interlevel dielectric layer 70a filling the space between the first sidewall spacers 66 on the sidewalls of fin structures 25a, 25b that are adjacent to a back bias electrode 35. The first interlevel dielectric layer 70a may be composed of any dielectric material, such as an oxide, nitride or oyxnitride material. For example, the first interlevel dielectric layer 70a may be composed of any dielectric material used in microelectronic and nanoelectronic structures, which can include $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The first interlevel dielectric layer 70a may be deposited using chemical vapor deposition, deposition from solution, spin on deposition and combinations thereof. Following deposition, a planarization process may be applied to the upper surface of the first interlevel dielectric layer 70a.

FIG. 9 depicts one embodiment of forming a second sidewall spacer 67 on outside sidewalls of the first and second fin structures 25a, 25b. In some embodiments, forming the second sidewall spacers 67 may begin with forming an etch mask 68 overlying the portion of the substrate including the back bias electrode, and removing the cap dielectric layer 52 with an etch process, such as an etch process that is selective to the sacrificial spacer layer 51, as well as the etch mask 68. Removing the cap dielectric layer 53 exposes upper sidewalls of the fin structures 25a, 25b. The second sidewall spacers 67 are formed on the exposed upper sidewalls of the fin structures 25a, 25b using a conformal deposition process, such as plasma enhanced chemical vapor deposition (PECVD), following by an anisotropic etchback process, such as reactive ion etch. The second sidewall spacers 67 are similar to the first sidewall spacers 66. Therefore, the above description for the first sidewall spacers 66 can provide further description of the second sidewalls spacers 67. For example, the composition of the first sidewall spacers 66 can provide at least one embodiment for the composition of the second sidewall spacer 67.

Figure 10:
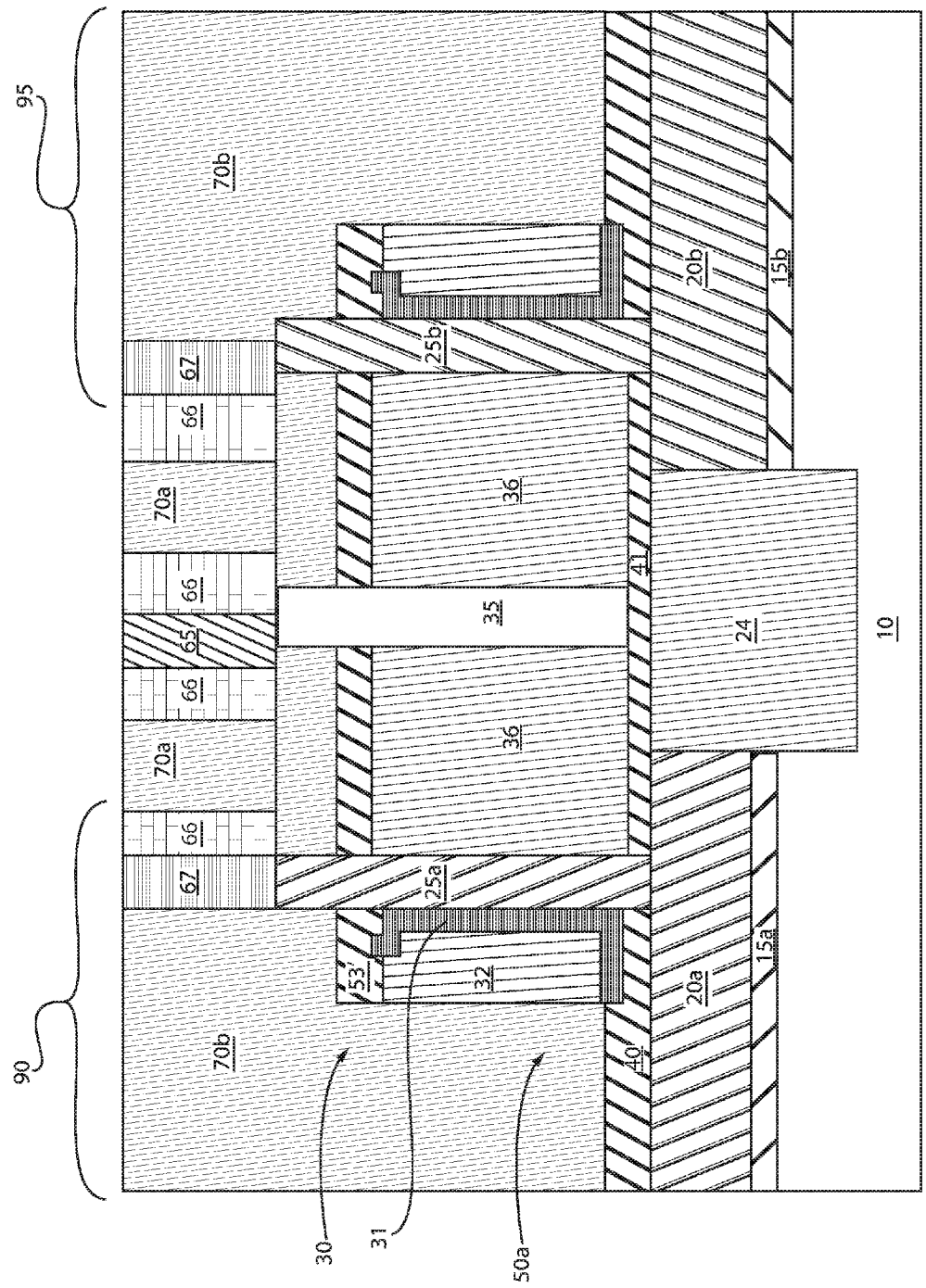
FIG. 10 is a side cross-sectional view of removing the remaining portion of the sacrificial gate layer, forming a common floating gate structure in electrical communication with the first and second fin structures, and forming a second interlevel dielectric layer, in accordance with one embodiment of the present disclosure.

FIG. 10 depicts one embodiment of removing the remaining portion of the sacrificial gate layer 60, forming a common floating gate structure 30 in electrical communication with the first and second fin structures 25a, 25b, and forming a second interlevel dielectric layer 70b.

FIG. 10 depicts one embodiment of removing a majority of the material stack that includes the sacrificial gate layer 60. In some embodiments, with the etch mask 68 described above reference to FIG. 9 still present, an anisotropic etch, such as reactive ion etch (RIE), that is selective to the second sidewall spacers 67, the dielectric fin cap 65 and the first dielectric spacer 40 removes a majority of the sacrificial spacer layer 53, and the sacrificial gate layer 60. Due to the anisotropic nature of the etch process, a remaining portion of the sacrificial spacer layer 53' and a remaining portion of the can be sacrificial gate layer present underlying the second sidewall spacers 67.

In some embodiments, prior to forming the gate dielectric 31 for the common gate structure 30, the remaining portion of the sacrificial gate layer 60 that can be present underlying the second sidewall spacers 67 may be removed using an isotropic selective etch, such as a plasma etch, gas etch or wet etch process. The etch process may also remove the dielectric surface 61 of the sidewall surface of the sacrificial gate layer 60. The etch process may be selective to the fin structures 25a, 25b. Following the isotropic etch, the sidewalls of the fin structures 25a, 25b that provide the channel regions of the n-type VFET 50a and the p-type VFET 50b may be exposed.

FIG. 10 depicts forming a gate dielectric 31 for a common gate structure 30 to each of the channel regions 25a, 25b for each of the n-type VFET 50a and the p-type VFET 50b. In one embodiment, the gate dielectric 31 for the common floating gate vertical transistor read only memory (ROM) device 100 may have a thickness ranging from 1 nm to 10 nm. In another embodiment, the gate dielectric 31 for common floating gate vertical transistor read only memory (ROM) device 100 may have a thickness ranging from 1 nm to 3 nm.

In some embodiments the gate dielectric 31 may be composed of a high-k gate dielectric. As used herein, "high-k" denotes a dielectric material featuring a dielectric constant (k) higher than the dielectric constant of SiO2 at room temperature. For example, the gate dielectric layer 31 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric 31 include hafnium silicate, hafnium silicon oxynitride or combinations thereof. The gate dielectric 31 may be deposited using chemical vapor deposition methods, such as plasma enhanced chemical vapor deposition (PECVD). In other embodiments, the gate dielectric 31 may be deposited using atomic layer deposition (ALD).

FIG. 10 also depicts forming a gate conductor 32 for the common gate structure 30 on the gate dielectric 31. The gate conductor 32 may be formed using deposition, patterning and etch processes. The gate conductor 32 may be formed directly on the gate dielectric 31 and may be composed of one or more electrically conductive materials, such as metals and electrically conductive semiconductors. For example, the gate conductor 32 may be composed of a work function metal that can be selected to provide a p-type work function metal layer and an n-type work function metal layer. In one embodiment, a p-type work function metal layer for the gate conductor 32 may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the n-type work function metal layer for the gate conductor 32 can be composed of at least one of TiAl, TaN, TiN, HfN, HfSi, or combinations thereof. In addition to the above described work function metals, the gate conductor 32 may be composed of a metal selected from tungsten (W), tungsten nitride (WN) or combinations thereof. In one or more embodiments, the gate conductor 32 is tungsten (W). In another embodiments, the gate conductor 32 may be doped semiconductor material, such as n-type doped polysilicon.

The material layer for the gate conductor 32 may be deposited by CVD, e.g., plasma enhanced chemical vapor deposition (PECVD). In other examples, the material layer for the gate conductor 32 may be deposited using physical vapor deposition, such as sputtering. In yet further examples, the material layer for the gate conductor 32 may be deposited using plating, electroplating, electroless deposition, and combinations thereof.

Following deposition of the material layer for the gate conductor 32, an etch process, such as reactive ion etch (RIE), may pattern the deposited material layers to the appropriate geometry for the common gate structure 30. The term "common" as used to describe the common gate structure 30 denotes that the common gate structure 30 is simultaneously in contact with both the fin structures 25a, 25b of the n-type VFET 50a and the p-type VFET 50b.

FIG. 10 also depicts forming a second interlevel dielectric layer 70b. The second interlevel dielectric layer 70b may be formed over the structures in the n-type region 90 and the p-type region 95 of the substrate, and may be composed of any dielectric material, such as an oxide, nitride or oyxnitride material. The second interlevel dielectric layer 70b is similar to the first interlevel dielectric layer 70a. Therefore, further details for the second interlevel dielectric 70b may be found in the above description of the first interlevel dielectric layer 70a.

Figure 11:
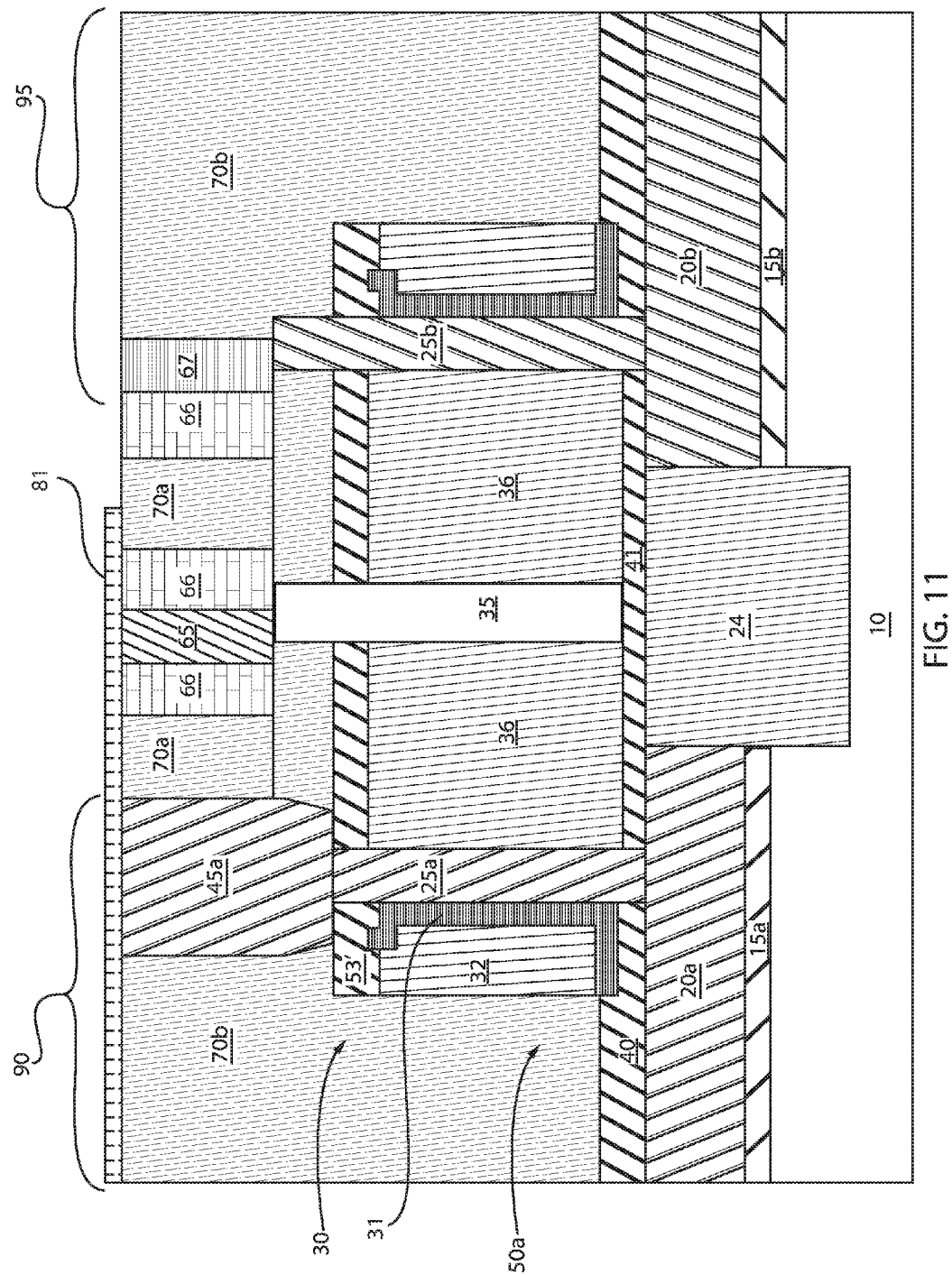
FIG. 11 is a side cross-sectional view depicting epitaxially forming a source/drain region on the upper surface of the fin structures, in accordance with one embodiment of the present disclosure.

FIG. 11 depicts epitaxially forming a source/drain region 45a, 45b on the upper surface of the fin structures 25a, 25b. Each of the second source/drain region 45a, 45b may be formed using an epitaxial deposition process. The second source/drain region 45a that is present in the n-type FET region 90 may be doped to an n-type conductivity; and the second source/drain region 45b that is present in the p-type region 95 may be doped to a p-type conductivity. Block masks may be employed to individually process the second source/drain regions 45a, 45b for the n-type vertically orientated field effect transistor 50a and the p-type vertically orientated field effect transistor 50b. For example, in the illustration provided in FIG. 11, the second source/drain region 45a of the n-type VFET 50a has been formed, and a block mask 81 is formed over the second source/drain region 45a for the n-type VFET 50a that exposes the p-type region 95 of the device for forming the second source/drain region 45b for the p-type vertically orientated field effect transistor 50b.

Each of the second source/drain regions 45a, 45b may be formed using epitaxial growth processes. For example, to epitaxially form the second source/drain regions 45a, 45b, the dielectric cap 65 that is present over the fin structures 25a, 25b may first be removed by a selective etch. Removing the dielectric cap 65 from the fin structures 25a, 25b exposes a source/drain deposition surface portion of the fin structures 25a, 25b that can provide for epitaxial growth. The dielectric cap 65 remains atop the back bias electrode 35 to obstruct any epitaxial semiconductor material from being deposited on the back bias electrode 35.

The second source/drain regions 45a, 45b are similar to the first source/drain regions 20a, 20b in base composition and dopant conductivity type. Therefore, the above description of the compositions for the first/source drain regions 20a, 20b, as well as their epitaxial growth process, are suitable for describing at least one embodiment of the composition and dopant type for the second source/drain regions 45a, 45b. For example, the second source/drain regions 45a, 45b may be composed of type IV semiconductor material, such as silicon (Si), or a type III-V semiconductor material, such as gallium arsenide (GaAs). Further, the second source/drain regions 45a, 45b may be in-situ doped to provide their conductivity type, doped using ion implantation, or doped using a combination of ion implantation and in situ doping. In the embodiments depicted in FIGS. 1A, 1B and 11, the second source/drain regions 45a, 45b are drain regions, while the first source/drain regions are source regions, but the positioning of the source and drain regions may be reversed in other embodiments.

Referring to FIGS. 1A and 1B, following formation of the second source/drain regions 45a, 45b, via contacts 34a, 34b, 36 may be formed to each of the first source/drain regions 20a, 20b and to the second source/drain regions 45a, 45b. There is no direct via contact to the common gate structure 30. The common gate structure 30 is a floating gate. A single via contact 35, i.e., a common via contact 35, is formed in direct electrical contact to both the second source/drain region 45a in the n-type region 90 and the second source/drain region 45b in the p-type region 95. The n-type vertically orientated field effect transistor 50a and the p-type vertically orientated field effect transistor 50b are connected in series. The common via contact 35 may also be referred to as a "VC" contact. The via contact 34a to the first source/drain region 20a in the n-type region 90 is separate from the via contact 34b to the first source/drain region 20b in the p-type region 95. The via contacts 34a, 34b to the first source/drain regions 20a, 20b are also separate from the common via contact 35 to the second source/drain regions 45a, 45b. The via contact 34a to the first source/drain region 20a of the n-type vertically orientated field effect transistor 50a may also be referred to as "VL". The via contact 34b to the second source/drain region 20b of the p-type vertically orientated field effect transistor 50b may also be referred to as "VH".

A via contact 37 may also be formed to the back bias electrode 35. The via contact 37 to the back bias electrode 35 may include a wrap around contact on polysilicon, and may be referred to as back bias control (Vx).

The via contacts 34a, 34b, 36, 37 may be produce by forming a via opening through the interlevel dielectric layer 70a, 70b; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the via contacts 34a, 34b, 36, 37. The electrically conductive material may be deposited into the via opening using physical vapor deposition (PVD). Examples of PVD processes suitable for depositing the metal for the via contacts 34a, 34b, 36, 37 include plating, electroplating, electroless plating, sputtering and combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for forming a PROGRAMMABLE READ ONLY MEMORY (ROM) INTEGRATED IN TIGHT PITCH VERTICAL TRANSISTOR STRUCTURES, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A memory device comprising:
   a common floating gate structure in simultaneous electrical communication with a first fin structure of a first conductivity type vertically orientated semiconductor device and a second fin structure of a second conductivity type vertically orientated semiconductor device; and
   a back bias electrode present between the first and second fin structures embedded in a dielectric material positioned in a central portion of the common floating gate structure, the back bias electrode overlying an isolation region that is separating a first region of the substrate including the first conductivity type vertically orientated semiconductor device from a second region of the substrate including a second conductivity type vertically orientated semiconductor device.

2. The memory device of claim 1, wherein the memory device is a vertical transistor read only memory (ROM).

3. The memory device of claim 1, wherein a first source/drain region for each of the conductivity type vertically orientated semiconductor device and the second conductivity type vertically orientated semiconductor device is positioned at an upper surface of the substrate.

4. The memory device of claim 3, wherein a counter doped layer is present underlying the first source/drain region.

5. The memory device of claim 1, wherein the first and second fin structures are comprised of a monocrystalline silicon and the back bias electrode is comprised of n-type doped polycrystalline silicon.

6. The memory device of claim 5, wherein the common floating gate structure is separated from each of the first source/drain region and the second source/drain region by a first dielectric spacer layer.

7. The memory device of claim 6, wherein the back bias electrode is separated from the isolation region by a second dielectric spacer layer.

8. The memory device of claim 1, wherein the back bias electrode is comprised of a metal selected from the group consisting of tantalum, tungsten, titanium, copper, aluminum, silver, platinum, gold and combinations thereof.

9. The memory device of claim 1, wherein the first fin structure is present atop the first source/drain region for the first conductivity type vertically orientated device, and the second fin structure is present atop the first source/drain region for the second conductivity type vertically orientated device, wherein a second source/drain region for each of the first and second conductivity type vertically orientated semiconductor devices is present on an opposing end of said first and second fin structures that is in contact with the first source/drain regions.

10. The memory device of claim 9, wherein the common floating gate structure is comprised of a high-k gate dielectric layer that is present in direct contact with the first and second fin structures, and a gate conductor that is in contact with the high-k gate dielectric layer.

11. The memory device of claim 10, wherein a common via connect structure is simultaneously in electrical communication with each of the second source/drain regions for each of the first and second conductivity type vertically orientated semiconductor devices, the common via connect structure being separate from a first via connect structure to a first source/drain region of the first conductivity type vertically orientated semiconductor device, and the common via connect structure being separate from a second via connect structure to a second source/drain region of a second conductivity type vertically orientated semiconductor device.

12. The memory device of claim 11, wherein the first conductivity type vertically orientated semiconductor device is an n-type field effect transistor, and the second conductivity type vertically orientated semiconductor device is a p-type field effect transistor.

13. The memory device of claim 1, wherein the first fin structure and the second fin structure are separated from said back bias electrode that is adjacently positioned to the first and second fin structures by a pitch ranging from 25 nm to 40 nm.

14. A memory device comprising:
a first conductivity type semiconductor device in a first region of a substrate and a second conductivity type semiconductor device in a second region of the substrate;
a first source/drain region for each of the first and second conductivity type semiconductor devices is formed atop the substrate;
a common floating gate structure is present in simultaneous electrical communication to a first vertically orientated channel region for the first conductivity type semiconductor device, and a second vertically orientated channel region for the second conductivity type semiconductor device;
a back bias electrode present between the first and second fin structures embedded in an dielectric positioned in a central portion of the common floating gate conductor; and
a commonly contacted second source/drain region present on an end of the first and second vertically orientated channel regions that is opposite the first source/drain region for each of the first and second conductivity type semiconductor devices.

15. The memory device of claim 14 further comprising a separate contact is in contact with each of the first source/drain regions.

16. A method of forming a memory device comprising:
forming a first conductivity type vertically orientated semiconductor device in a first region of a substrate;
forming a second conductivity type vertically orientated semiconductor device in a second region of the substrate; and
forming a common floating gate structure including a back bias electrode in simultaneous electrical communication with a first fin structure of the first conductivity type vertically orientated semiconductor device and a second fin structure of the second conductivity type vertically orientated semiconductor device, wherein the back bias electrode is present between the first and second fin structures embedded in an dielectric positioned in a central portion of the common floating gate conductor.

17. The method of claim 16, wherein the first fin structure and the second fin structure are separated from said back bias electrode that is adjacently positioned to the first and second fin structures by a pitch ranging from 25 nm to 40 nm, and the first fin structure, the second fin structure, and the back bias electrode have substantially a same geometry.

18. The method of claim 16, wherein the first conductivity type vertically orientated semiconductor device comprises a first source region present on a semiconductor substrate, the first fin structure is epitaxially formed on the first source region, and a first drain region epitaxially formed on an opposing end of the first fin structure.

19. The method of claim 18, wherein the second conductivity type vertically orientated semiconductor device comprises a second source region present on a semiconductor substrate, the first second structure is epitaxially formed on the second source region, and a second drain region epitaxially formed on an opposing end of the second fin structure.

20. The method of claim 19 further comprising forming a common contact to the first drain region and the second drain region.

* * * * *